(12) United States Patent
Takeda

(10) Patent No.: US 6,320,248 B1
(45) Date of Patent: Nov. 20, 2001

(54) LEAD FRAME AND METHOD OF FABRICATING SEMICONDUCTOR DEVICE INCLUDING THE LEAD FRAME

(75) Inventor: Hiromitsu Takeda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/469,078

(22) Filed: Dec. 21, 1999

(51) Int. Cl.⁷ .................................................. H01L 23/495
(52) U.S. Cl. ............................................. 257/671; 257/676
(58) Field of Search .................................. 438/111, 112, 438/123, FOR 366, FOR 567, FOR 377, FOR 380; 257/676, 671

(56) References Cited

U.S. PATENT DOCUMENTS 5,917,235 * 6/1999 Imura .
6,028,356 * 2/2000 Kimura .

FOREIGN PATENT DOCUMENTS

| 8-195467 | 7/1996 | (JP) . |
| 9-116074 | 5/1997 | (JP) . |
| 10-125845 | 5/1998 | (JP) . |
| 10-303357 | 11/1998 | (JP) . |

* cited by examiner

Primary Examiner—David E. Graybill
(74) Attorney, Agent, or Firm—Scully, Scott, Murphy and Presser

(57) ABSTRACT

There is provided a lead frame including first and second rows of inner leads each of which is electrically connected to an associated electrode of a semiconductor chip and which are situated at opposite sides about the semiconductor chip, first and second rows of outer leads each of which is electrically connected to an associated inner lead in the first and second rows of inner leads, respectively, a tie bar connecting a first outermost inner lead in the first row of inner leads to a second outermost inner lead in the second row of inner leads, and a control plate comprised of first branches extending from the first outermost inner lead towards the second outermost inner lead and second branches extending from the second outermost inner lead towards the first outermost inner lead, the control plate being connected to the tie bar. Since the control plate is connected to the tie bar, the control plate is stabilized without being influenced by flow of resin introduced into a cavity in a step of sealing a semiconductor device with resin.

25 Claims, 14 Drawing Sheets

LEAD FRAME AND METHOD OF FABRICATING SEMICONDUCTOR DEVICE INCLUDING THE LEAD FRAME

BACKGROUND OF THE INVENTION

1. Field of the Invention

The invention relates to a lead frame and a method of fabricating a semiconductor device including the same.

2. Description of the Related Art

As a semiconductor integrated circuit, in particular, a dynamic random access memory (DRAM) has been integrated higher and higher, a semiconductor device is packaged predominantly in a lead-on-chip structure (hereinafter, referred to simply as "LOC structure").

LOC structure is used in place of a chip-on-lead structure, so-called COL structure, which has been used for packaging a semiconductor device including a lead frame having an opening in the vicinity of a center, a hanging lead bridging over the lead frame in a length-wise direction thereof, and an island on which LSI chip is to be mounted.

In order to accomplish higher integration in a semiconductor device, it would be unavoidable for LSI chip to have a greater size, because LSI chip is small in size relative to a semiconductor device, and further because there are standards for the number of pins to be fabricated in a semiconductor device and a pitch between adjacent pins. An increase in size causes an upper limit in integration in a semiconductor device. The above-mentioned COL structure has been developed in order to overcome this problem.

FIG. 1 is a plan view of a semiconductor device having the above-mentioned LOC structure.

As illustrated in FIG. 1, a semiconductor device 1 having a LOC structure is comprised of a lead frame 50 and a semiconductor chip 2 both covered with a resin package 10.

The lead frame 50 is comprised of a plurality of inner leads 51, a plurality of outer leads 52 each connected to an associated inner lead 51, and tie bars 53 connecting outermost outer leads 52 to each other. The tie bar 53 acts as a barrier for stopping resin flow in a later mentioned step of sealing a semiconductor device with resin. The inner leads 51 are located in a length-range of the tie bars 53, and the outer leads 52 are located out of a length-range of the tie bars 53.

The semiconductor chip 2 is electrically connected to the lead frame 50 through the inner leads 51. In order to prevent electrical leakage among the inner leads 51, an electrically insulating adhesive tape 5 are adhered to the semiconductor chip 2 in parallel with and outside electrodes 3 mounted on the semiconductor chip 2. Distal ends 51a of the inner leads 51 are fixed on the adhesive tape 5, and are electrically connected to the electrodes 3 one to one through wires 4.

Hereinbelow is explained a step of sealing a semiconductor device with resin.

In the step of sealing a semiconductor device with resin, as illustrated in FIG. 2, the lead frame 50 fixed on the semiconductor chip 2 with the electrically insulating adhesive tape 5 being sandwiched therebetween is interposed between an upper mold 61 and a lower mold 62.

The upper and lower molds 61 and 62 are formed at surfaces thereof with recesses. The upper and lower molds 61 and 62 are engaged to each other so that the recesses define a cavity 60. The cavity 60 defines an outer shape of a semiconductor package.

The lower mold 62 is formed at a surface thereof with a recess, which defines a gate 63 when the upper and lower molds 61 and 62 are engaged to each other. Resin is introduced into the cavity 60 through the gate 63. The lower mold 62 is formed further with a runner 64 in which resin is pooled, and a pot 65 defining a cylindrical path.

In the step of sealing a semiconductor device with resin, heated resin is introduced first into the pot 65. Resin is then transferred into the runner 64 by means of a plunger (not illustrated) acting as a piston, and thereafter, introduced into the cavity 60 through the gate 63. Thus, the semiconductor chip 2 and the lead frame 50 are sealed with resin.

After the semiconductor chip 2 and the lead frame 50 have been sealed with resin, the tie bars 53 to which the inner leads 51 and the outer leads 52 are connected are cut out to thereby separate the inner leads 51 from one another.

FIG. 14(A) illustrates a lead frame 50C where the tie bars 53 have been cut out. FIG. 14(B) is an enlarged view of an encircled portion in FIG. 14(A).

The tie bar 53 is cut out at hatched regions 53a illustrated in FIG. 14(B) to thereby allow the inner leads 51 and the outer leads 52 to be electrically independent from one another, as illustrated in FIG. 14(A).

Though FIG. 14(A) and FIG. 14(B) illustrate the lead frame 50C in accordance with a later mentioned third embodiment of the present invention, FIG. 14(A) and FIG. 14(B) are used herein for the purpose only of explaining a step of cutting out tie bars. The description with references to FIG. 14 does not mean that FIG. 14(A) and FIG. 14(B) constitutes prior art.

Then, a semiconductor device having been sealed with resin is tested with respect to electrical communication. Test for electrical communication is conducted through the use of a tester illustrated in FIG. 3.

The illustrated tester is comprised of a socket 55 including an upper mold 56 and a lower mold 57. The lower mold 57 is formed at a surface thereof at opposite ends with recesses for exposing the outer leads 52 outside. Test pins 58 upwardly project from the lower mold 57 towards the upper mold 56 in the recesses so that the test pins 58 make contact with the outer leads 52 by virtue of resiliency of the outer leads 52.

The lead frame 50 already having experienced the step of cutting out the tie bars 53 is interposed between the upper mold 56 and the lower mold 57. When the upper and lower molds 56 and 57 are engaged to each other, the recesses formed with the lower mold 57 define a space between the upper and lower molds 56 and 57. The outer leads 52 are exposed to the space, and are electrically tested by means of the test pin 58 to which a testing device (not illustrated) is electrically connected.

Hereinbelow is explained a step of conducting screening inspection.

Screening inspection is conducted after a lead frame of a semiconductor chip 1 having experienced a step of cutting out the tie bars is individually selected, and distal ends of the outer leads 52 are made bent to thereby complete a final product, as illustrated in FIG. 4A. Then, as illustrated in FIG. 4B, the semiconductor chip 1 is mounted on an insulating base 59, and each of the outer leads 52 is electrically tested by means of the test pin 58 to which a testing device (not illustrated) is electrically connected.

A semiconductor chip has been fabricated smaller and smaller in size as technology has developed, and accordingly, the semiconductor chip 1 illustrated in FIG. 1 unavoidably has a space between outermost inner leads 51b. This space causes various problems. For instance, there is produced void in the space because of resin flow in the step of sealing a semiconductor chip with resin. A stress is exerted on the wires 4 due to resin flow, which causes the wires 4 to be deflected when resin is introduced into the cavity 60 illustrated in FIG. 2.

In order to overcome these problems, Japanese Unexamined Patent Publication No. 9-116074 has suggested a lead frame as illustrated in FIG. 5. The illustrated lead frame 50 is designed to have a balancing portion 30 comprised of a plurality of branches 51c inwardly extending from outermost inner leads 51b. The balancing portion 30c controls resin flow.

Japanese Unexamined Patent Publication No. 9-116074 has suggested another lead frame including a pair of outer inner leads which are bent a plurality of times to thereby define the balancing portion 30 for controlling resin flow.

Japanese Unexamined Patent Publication No. 9-116074 has suggested still another lead frame including the balancing portion 30 connected only to the tie bar 53, as illustrated in FIG. 6.

However, the above-mentioned conventional lead frames are accompanied with the following problems.

The lead frame 50 illustrated in FIG. 5 is accompanied with a problem that since the branches 51c extending from the outermost inner leads 51b and constituting the balancing portion 30 are independent from one another, it would be difficult to properly form the lead frame 50, in particular, the inner leads 51.

In addition, the balancing portion 30 is likely to be deformed due to resin flow, which causes a problem that the balancing portion 30 protrudes out of a semiconductor package after carrying out the step of sealing a semiconductor device with resin.

Furthermore, the balancing portion 30 in the lead frame 50 illustrated in FIG. 5 is comprised merely of the branches 51c inwardly extending from the outermost inner leads 51b, a resonance band becomes unavoidably wider in the outermost inner leads 51b generally corresponding to a power source or GND. Hence, the balancing portion 30 might exert harmful influence such as noises on neighboring semiconductor devices.

The lead frame 50 illustrated in FIG. 6 can solve the problem of deformation of the balancing portion 30 to some degree. However, the problem that the balancing portion 30 protrudes out of a semiconductor package due to resin flow in a step of sealing a semiconductor device with resin remains unsolved even by the lead frame 50 illustrated in FIG. 6.

SUMMARY OF THE INVENTION

In view of the above-mentioned problems, it is an object of the present invention to provide a lead frame which is not deformed even by resin flow in a step of sealing a semiconductor device with resin and is capable of accomplishing electric stability.

In one aspect of the present invention, there is provided a lead frame including (a) a first row of inner leads each of which is electrically connected to an associated electrode of a semiconductor chip, (b) a second row of inner leads each of which is electrically connected to an associated electrode of a semiconductor chip, the first and second rows of inner leads being situated at opposite sides about the semiconductor chip, (c) a first row of outer leads each of which is electrically connected to an associated inner lead in the first row of inner leads, (d) a second row of outer leads each of which is electrically connected to an associated inner lead in the second row of inner leads, (e) a tie bar connecting a first outermost inner lead in the first row of inner leads to a second outermost inner lead in the second row of inner leads, and (f) a control plate comprised of first branches extending from the first outermost inner lead towards the second outermost inner lead and second branches extending from the second outermost inner lead towards the first outermost inner lead, the control plate being connected to the tie bar.

Since the control plate is connected to the tie bar, the control plate can be in stable condition, and is not influenced by flow of resin introduced into a cavity.

It is preferable that the lead frame further includes an electrically insulating adhesive tape which fixates the control plate relative to the first and second rows of inner leads.

It would be possible to prevent a part of the lead frame from being twisted or deformed due to resin flow, by fixating the control plate and the inner leads to each other through the electrically insulating adhesive tape.

It is preferable that the electrically insulating adhesive tape has a size extending to the tie bar.

The electrically insulating adhesive tape extending to the tie bar makes it possible to control resin flow, and prevent the lead frame from protruding out of a package.

It is preferable that the lead frame further includes an electrically insulating film to which the first and second rows of inner leads are fixed.

By fixing the inner leads to the electrically insulating film, it would be possible to stably fix the control plate and prevent deformation of the lead frame.

It is preferable that the electrically insulating film is sandwiched between the first and second rows of inner leads and a semiconductor chip.

It is preferable that the electrically insulating film has at least one opening through which distal ends of the first or second row of inner leads and associated electrodes of the semiconductor chip are exposed.

It is preferable that the electrically insulating film has a first opening through which distal ends of the first row of inner leads are exposed, a second opening through which distal ends of the second row of inner leads are exposed, and a third opening through which electrodes of a semiconductor chip to which the first and second rows inner leads are connected are exposed.

There is further provided a lead frame including (a) a first row of inner leads each of which is electrically connected to an associated electrode of a semiconductor chip, (b) a second row of inner leads each of which is electrically connected to an associated electrode of a semiconductor chip, the first and second rows of inner leads being situated at opposite sides about the semiconductor chip, (c) a first row of outer leads each of which is electrically connected to an associated inner lead in the first row of inner leads, (d) a second row of outer leads each of which is electrically connected to an associated inner lead in the second row of inner leads, (e) a tie bar connecting a first outermost inner lead in the first row of inner leads to a second outermost inner lead in the second row of inner leads, and (f) a control plate comprised of (f1) first branches extending from the first outermost inner lead towards the second outermost inner lead, (f2) second branches extending from the second outermost inner lead towards the first outermost inner lead, (f3) a first bar which connects distal ends of the first branches to one another, and (f4) a second bar which connects distal ends of the second branches to one another, the control plate being connected to the tie bar.

Since the distal ends of the inner leads are electrically connected to one another through the first and second bars, it is possible to prevent the control plate from being exposed out of a semiconductor package in a step of introducing resin into a cavity.

Outermost inner leads generally correspond to a power source or GND. For instance, when outermost inner leads correspond to GND, there is generated capacitance between a pair of the outermost inner leads, which would prevent fluctuation in a current due to switching.

In addition, it is possible to avoid neighboring semiconductor devices from being influenced by noises. In particular, when a semiconductor device is operated by digital signals, it would be possible to prevent generation of pulse current, and reduce influence caused by noises.

It is preferable that the first and second bars extend to the tie bar.

There is still further provided a lead frame including (a) a first row of inner leads each of which is electrically connected to an associated electrode of a semiconductor chip, (b) a second row of inner leads each of which is electrically connected to an associated electrode of a semiconductor chip, the first and second rows of inner leads being situated at opposite sides about the semiconductor chip, (c) a first row of outer leads each of which is electrically connected to an associated inner lead in the first row of inner leads, (d) a second row of outer leads each of which is electrically connected to an associated inner lead in the second row of inner leads, (e) a tie bar connecting a first outermost inner lead in the first row of inner leads to a second outermost inner lead in the second row of inner leads, and (f) a control plate comprised of (f1) first branches extending from the first outermost inner lead towards the second outermost inner lead, (f2) second branches extending from the second outermost inner lead towards the first outermost inner lead, (f3) a first connecting bar which connects an outermost one in the first branches to the tie bar, and (f4) a second connecting bar which connects an outermost one in the second branches to the tie bar.

It is preferable that the first and second connecting bars are located symmetrically with each other about a center of the tie bar.

The control plate may be connected to the tie bar in the vicinity of a center of the tie bar through the first and second connecting bars.

Since a gate is located generally at a center in a cavity, it would be possible to stably control resin flow by connecting the control plate to the tie bar in the vicinity of a center of the tie bar.

It is preferable that the control plate is comprised further of (f5) a first bar which connects distal ends of the first branches to one another, and (f6) a second bar which connects distal ends of the second branches to one another.

In another aspect of the present invention, there is provided a method of fabricating a semiconductor device, including the steps, in sequence, of (a) arranging an electrically insulating adhesive tape on a semiconductor chip, (b) adhering inner leads of a lead frame onto the electrically insulating adhesive tape, and (c) arranging an electrically insulating film onto the inner leads.

The method makes it possible to stably fix the inner leads and prevent the inner leads from being twisted due to resin flow.

There is further provided a method of fabricating a semiconductor device, including the steps, in sequence, of (a) arranging an electrically insulating adhesive tape on a semiconductor chip, (b) adhering inner leads of a lead frame onto the electrically insulating adhesive tape, (c) arranging an electrically insulating adhesive film onto the inner leads, and (d) adhering the inner leads to the electrically insulating adhesive film.

The method makes it possible to fix the inner leads without being influenced by resin flow in a step of sealing a semiconductor device with resin.

The advantages obtained by the aforementioned present invention will be described hereinbelow.

It would be possible to control resin flow in a step of sealing a semiconductor device with resin, to thereby prevent generation of void and deflection of wires, by connecting distal ends of the branches through the first and second bars and connecting the outermost inner leads to the tie bar through the first and second connecting bars.

It would be possible to prevent the lead frame from being exposed out of a semiconductor package by fixing the inner leads and the control plate by means of the electrically insulating film.

The outermost inner leads generally correspond to a power source or GND. Hence, by electrically connecting distal ends of the branches, there would be generated capacitance between the first and second branches, which would prevent fluctuation in a current, caused by switching.

In addition, it is possible to avoid neighboring semiconductor devices from being influenced by noises. In particular, when a semiconductor device is operated by digital signals, it would be possible to prevent generation of pulse current, and reduce influence caused by noises.

It is also possible to reduce resistance in the inner leads, which ensures stable power supply.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 7:
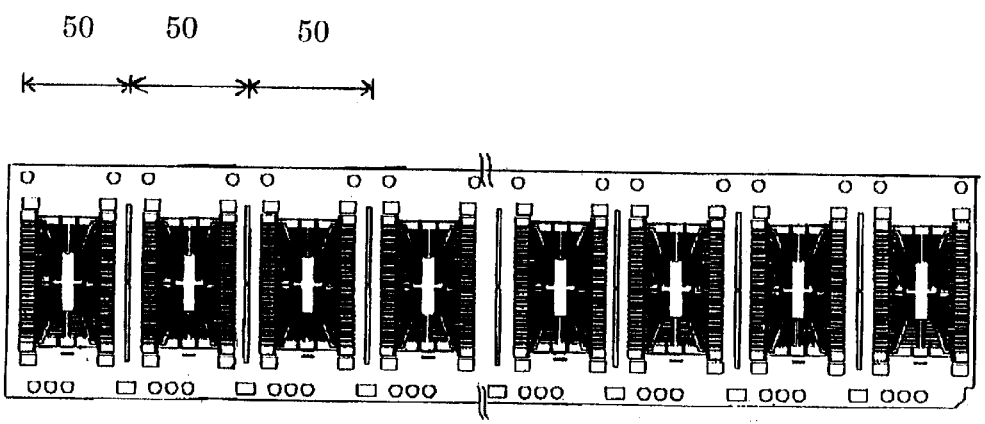
FIG. 7 is a plan view of a series of lead frames each in accordance with the first embodiment.

FIG. 7 is a plan view of a series of lead frames each in accordance with a preferred embodiment of the present invention.

As illustrated in FIG. 7, lead frames are in the form of a ribbon, and each one of the lead frames 50 is comprised of inner leads 51, outer leads 52 and tie bars 53. In embodiments explained hereinbelow, only one lead frame 50 is explained.

[First Embodiment]

Figure 8:
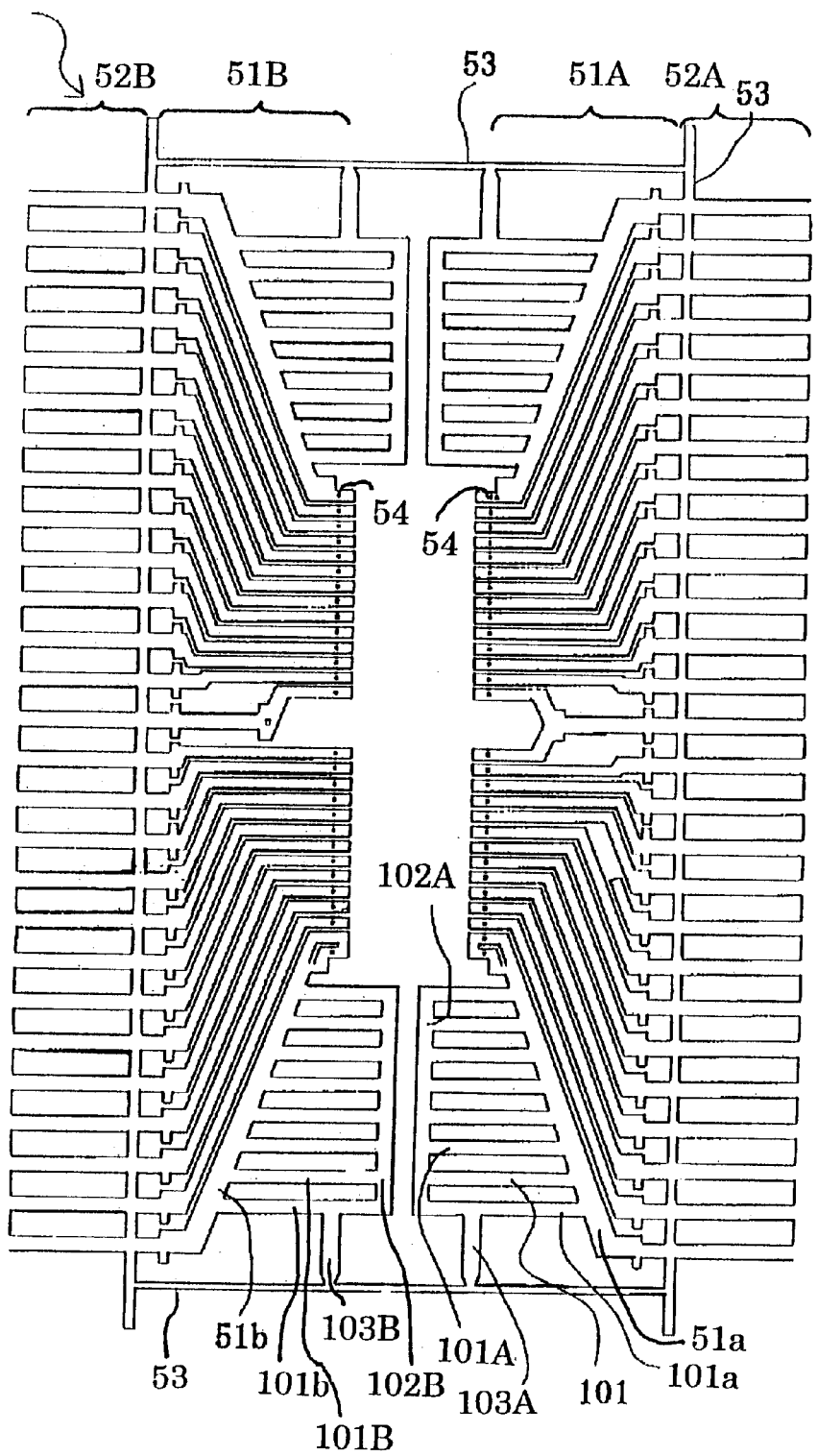
FIG. 8 is a plan view of a lead frame in accordance with the first embodiment.

FIG. 8 is a plan view of a lead frame 50A in accordance with the first embodiment.

The lead frame 50A is comprised of a first row of inner leads 51A each of which is electrically connected to an associated electrode 54 of a semiconductor chip, a second row of inner leads 51B each of which is electrically connected to an associated electrode 54 of a semiconductor chip and which are situated at an opposite side relative to the first row of inner leads 51A about the semiconductor chip, a first row of outer leads 52A each of which is electrically connected to an associated inner lead in the first row of inner leads 51A, a second row of outer leads 52B each of which is electrically connected to an associated inner lead in the second row of inner leads 51B, tie bars 53 connecting a first outermost inner lead 51a in the first row of inner leads 51A to a second outermost inner lead 51b in the second row of inner leads 51B, and a control plate 101.

The tie bars 53 are frames acting as a resin stopper, namely, stopping resin from flowing therebeyond in a step of sealing a semiconductor device with resin. As illustrated in FIG. 8, the first and second rows of inner leads 51A and 51B overlap the tie bars, whereas the first and second rows of outer leads 52A and 52B are located beyond the tie bars 53.

The control plate 101 is comprised of first branches 101A extending from the first outermost inner lead 51a towards the second outermost inner lead 51b, second branches 101B extending from the second outermost inner lead 51b towards the first outermost inner lead 51a, a first bar 102A which connects distal ends of the first branches 101A to one another, a second bar 102B which connects distal ends of the second branches 101B to one another, a first connecting bar 103A which connects an outermost one 101a in the first branches 101A to the tie bar 53, and a second connecting bar 103B which connects an outermost one 101b in the second branches 101B to the tie bar 53.

Thus, the control plate 101 is connected to the tie bar 53 through the first and second connecting bars 103A and 103B. The first and second connecting bars 103A and 103B are located symmetrically with each other about a center of the tie bar 53. However, it should be noted that it is not always necessary to arrange the first and second connecting bars 103A and 103B symmetrically with each other.

In accordance with the first embodiment, since the first and second connecting bars 103A and 103B connects the first and second rows of inner leads 51A and 51B to the tie bars 53, it is possible to reduce a stress which would cause the control plate 101 to expose out of a semiconductor package in a step of sealing a semiconductor device with resin.

Though the first and second connecting bars 103A and 103B are formed each by only one, it should be noted that the first and second connecting bars 103A and 103B may be formed by two or greater.

[Second Embodiment]

Figure 9:
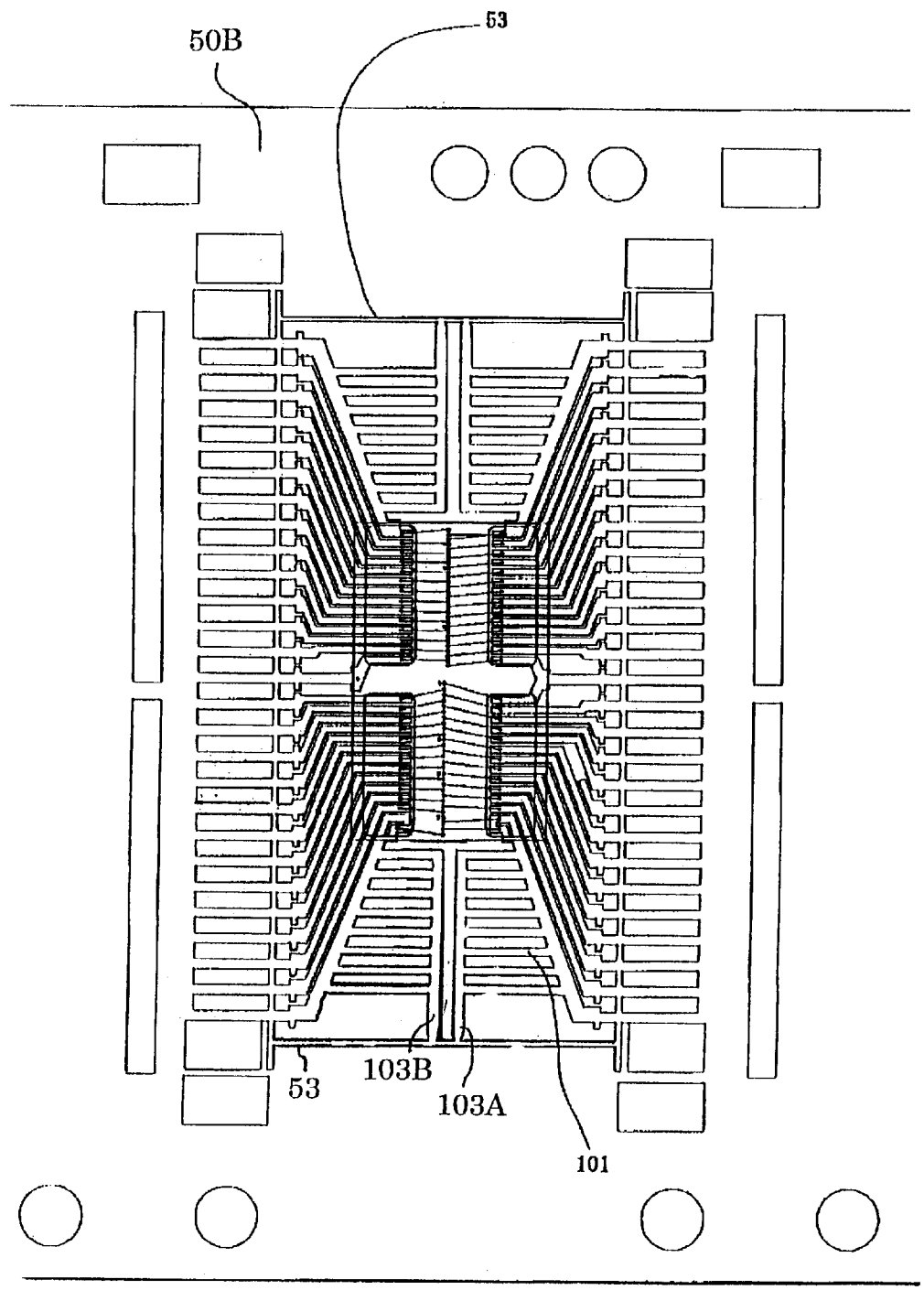
FIG. 9 is a plan view of a lead frame in accordance with the second embodiment.

FIG. 9 is a plan view of a lead frame in accordance with the second embodiment of the present invention.

The lead frame 50B in accordance with the second embodiment is structurally different from the lead frame 50A in accordance with the first embodiment in that the first and second connecting bars 103A and 103B are formed as extensions of the first and second bars 102A and 102B.

In accordance with the second embodiment, it is not necessary to separately form the first and second connecting bars 103A and 103B from the first and second bars 102A and 102B, which would reduce the number of steps of fabricating the control plate 101.

[Third Embodiment]

Figure 10:
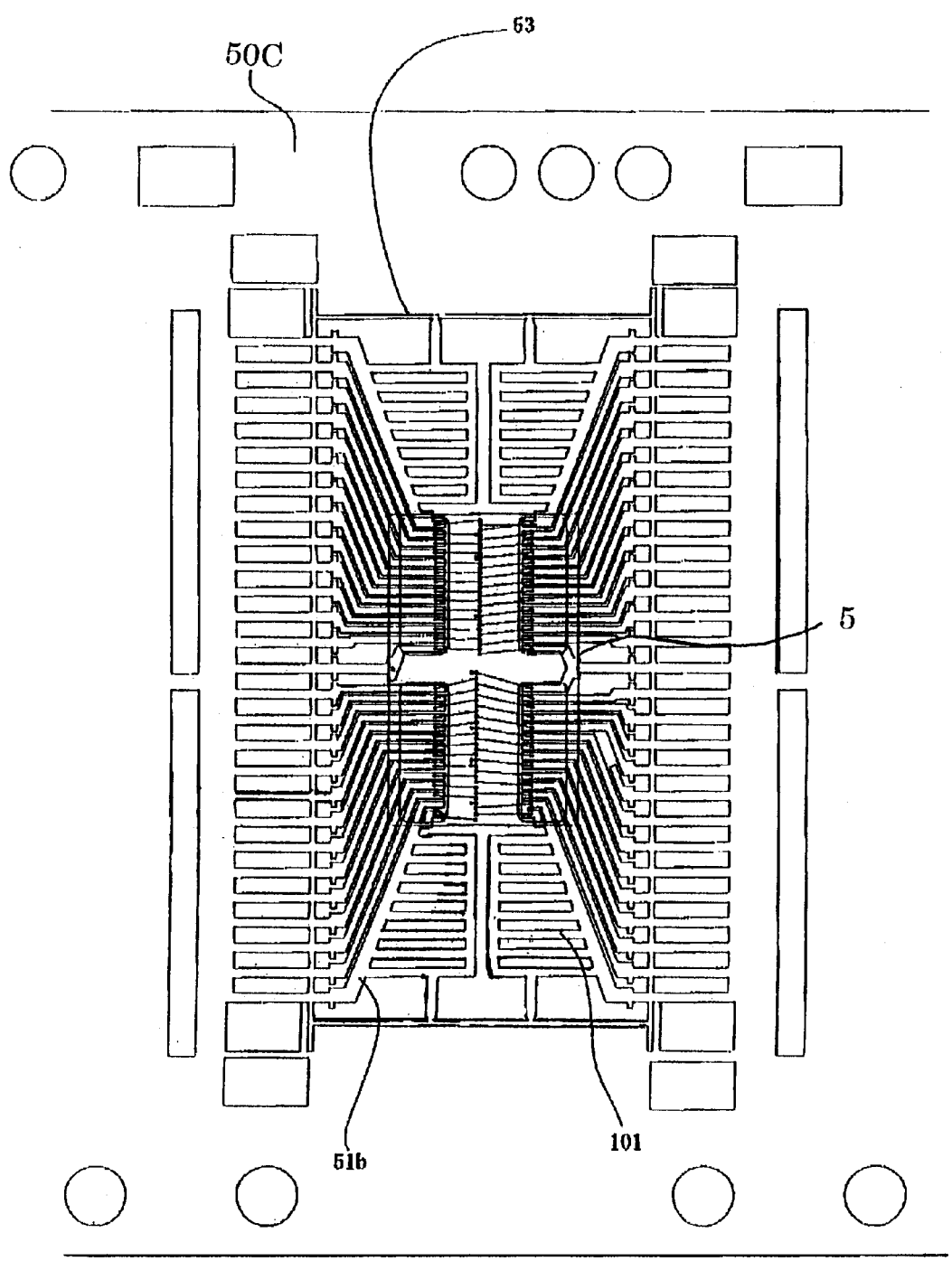
FIG. 10 is a plan view of a lead frame in accordance with the third embodiment.

FIG. 10 is a plan view of a lead frame in accordance with the third embodiment. The lead frame 50C in accordance with the third embodiment is designed to have the same structure as the structure of the lead frame 50A in accordance with the first embodiment, and further is mounted on LSI chip.

As illustrated in FIG. 10, an electrically insulating adhesive tape 5 is adhered to lower surfaces of the first and second rows of inner leads 51A and 51B at distal ends thereof. The lead frame 50C is mounted on LSI chip with the adhesive tape 5 being sandwiched therebetween.

Though the electrically insulating adhesive tape 5 has a size covering distal ends of the first and second rows of inner leads 51A and 51B therewith, the adhesive tape 5 may be designed to have a size extending either to the tie bar 53 or just short of the tie bar 53 unless the adhesive tape 5 prevents electrical insulating among the inner leads 51A and 51B.

[Fourth Embodiment]

Figure 11:
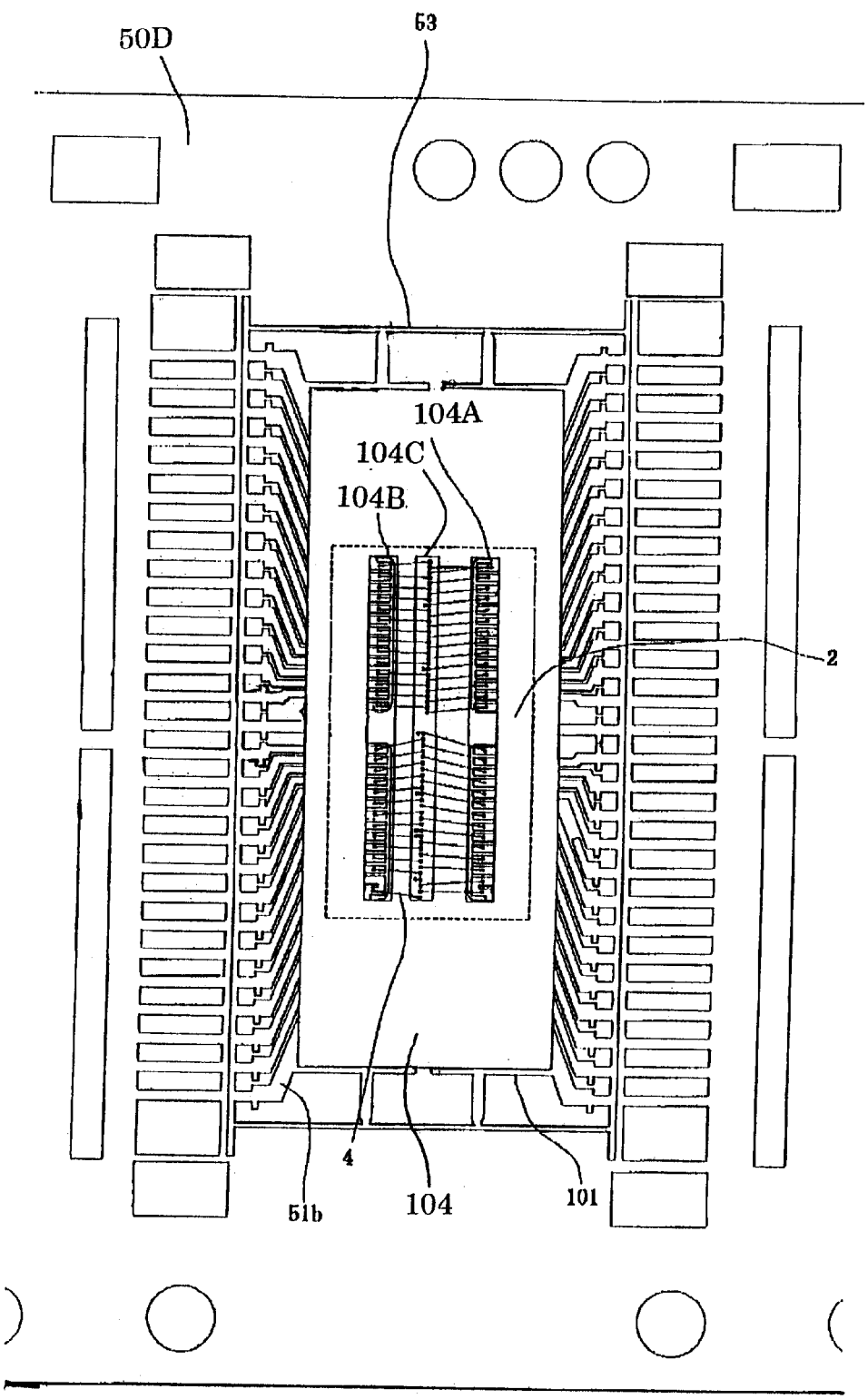
FIG. 11 is a plan view of a lead frame in accordance with the fourth embodiment.
Figure 12:
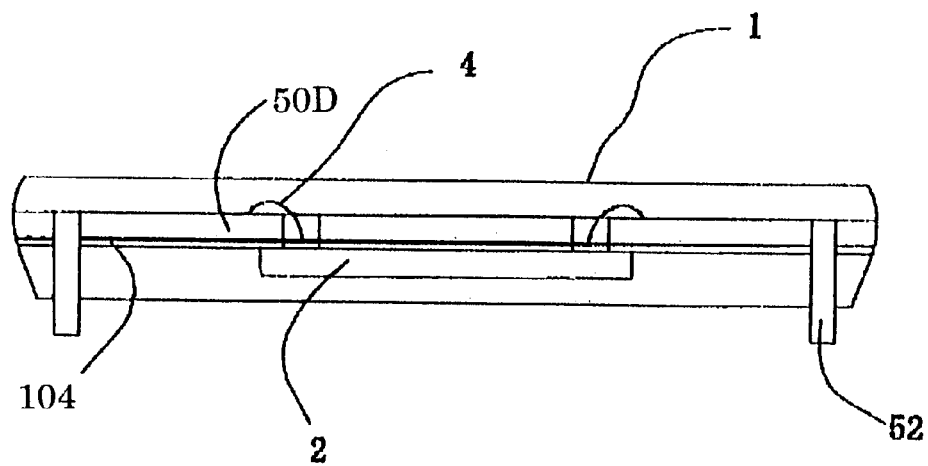
FIG. 12 is a cross-sectional view of a lead frame in accordance with a variant of the fourth embodiment.

FIG. 11 is a plan view of a lead frame in accordance with the fourth embodiment. The lead frame 50D in accordance with the fourth embodiment is designed to have the same structure as the structure of the lead frame 50A in accordance with the first embodiment, and further have an electrically insulating film 104 adhered on the first and second rows of inner leads 51A and 51B.

The electrically insulating film 104 is designed to have a first opening 104A through which distal ends of the first row of inner leads 51A are exposed, a second opening 104B through which distal ends of the second row of inner leads 51B are exposed, and a third opening 104C through which electrodes of a semiconductor chip 2 to which the first and second rows inner leads are connected are exposed.

The electrically insulating film 104 may be designed to have a size which does not prevent carrying out a step of sealing a semiconductor device with resin, unless the film 104 is located on the inner leads 51A and 51B.

As an alternative, the electrically insulating film 104 may be sandwiched between the lead frame 50D and LSI chip 2.

After the electrically insulating film 5 has been adhered to the inner leads 51A and 51B, electrodes arranged at a surface of LSI chip 2 are electrically connected to the distal ends of the inner leads 51A and 51B through wires 4.

Hereinbelow is explained a method of fabricating a semiconductor device having the lead frame in accordance with the third embodiment.

Figure 13:
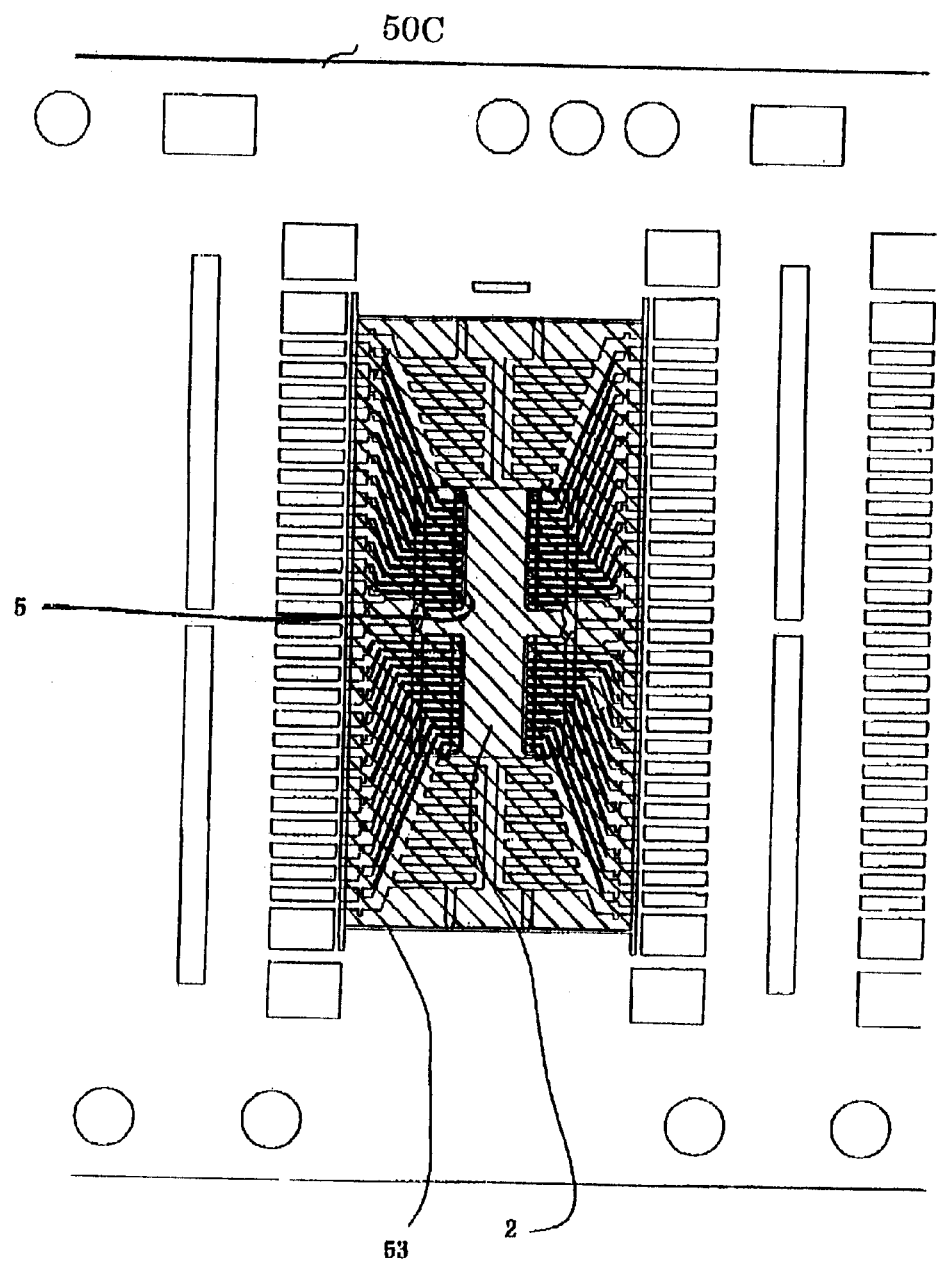
FIG. 13 is a plan view of a semiconductor device including a lead frame in accordance with the first embodiment, in a step of sealing with resin.

FIG. 13 is a plan view of a semiconductor device having been sealed with resin.

Figure 1:
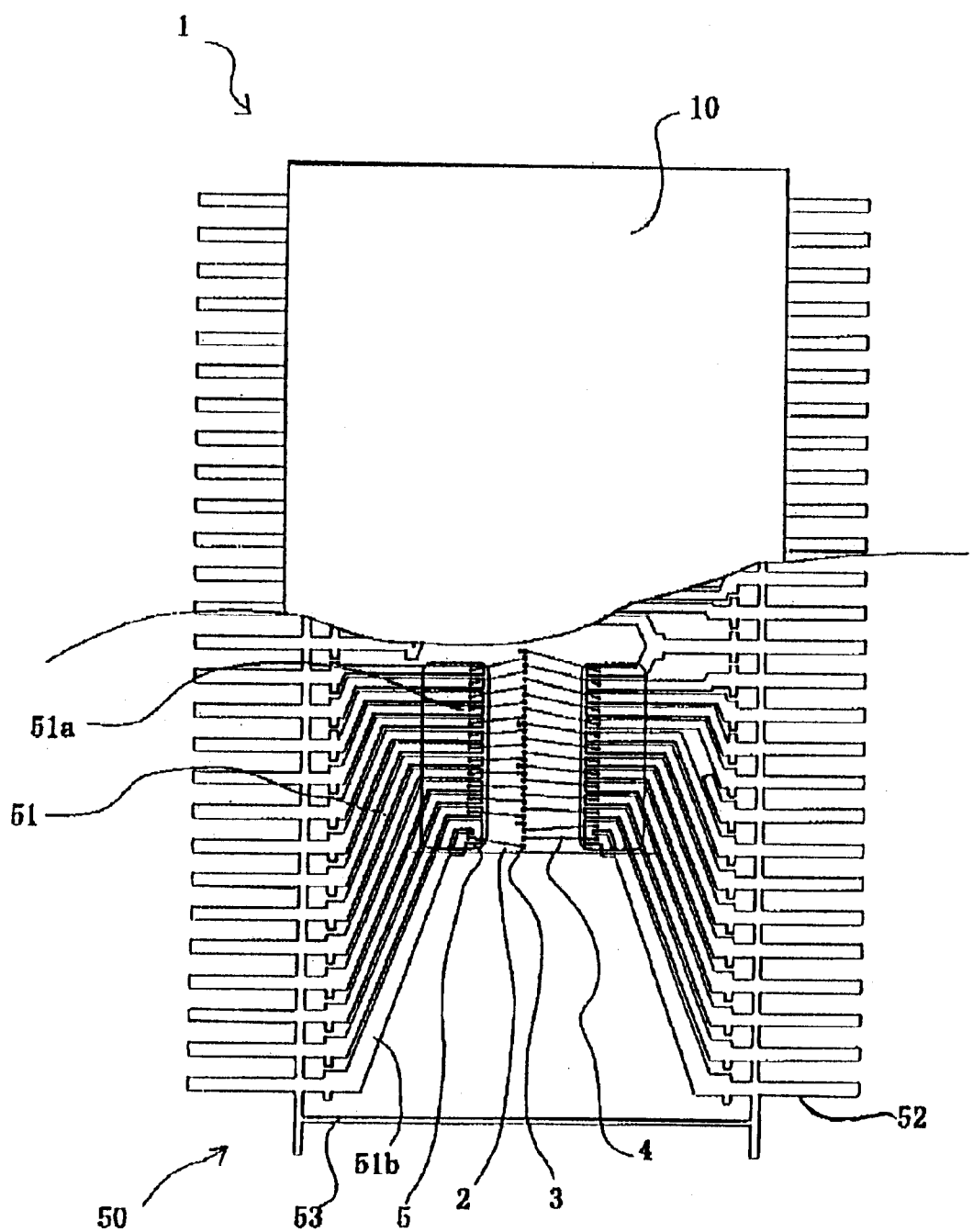
FIG. 1 is a plan view illustrating a conventional semiconductor device.
Figure 2:
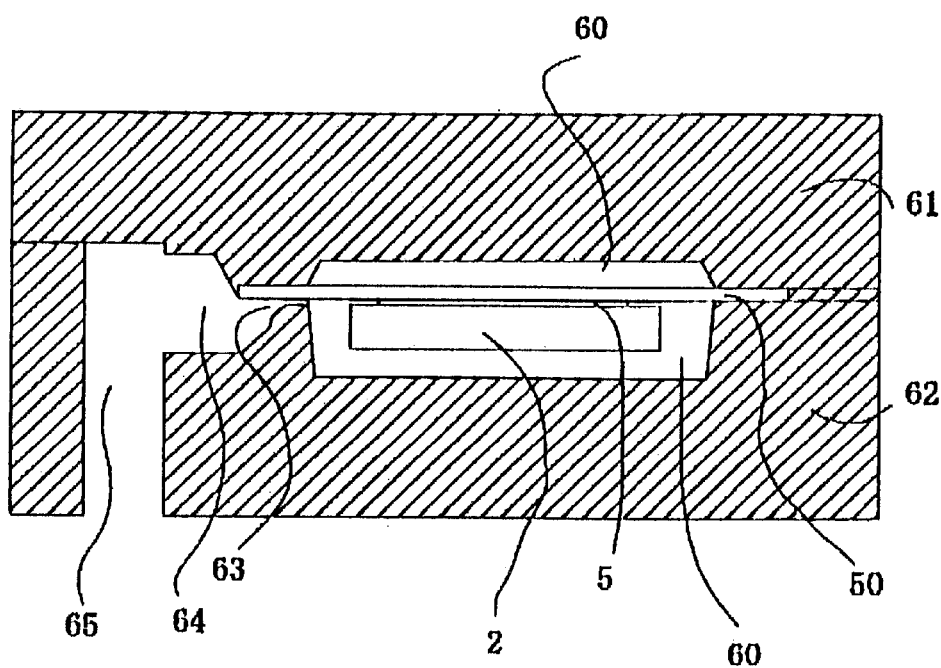
FIG. 2 is a cross-sectional view of an apparatus for sealing a semiconductor device with resin.

A semiconductor device is sealed with resin by means of the apparatus illustrated in FIG. 2. The lead frame 50C mounted on LSI chip 2 with the electrically insulating adhesive tape 5 being sandwiched therebetween is sealed or packaged with resin.

Since the tie bars 53 acts as a resin stopper, namely, stops resin to flow therebeyond, resin is pooled in a hatched area defined within the opposite tie bars 53, as illustrated in FIG. 13.

The tie bars 53 electrically connects the inner leads 51A and 51B to one another, and similarly electrically connects the outer leads 52A and 52B to one another. Hence, the tie bars 53 are cut out.

Figure 14:
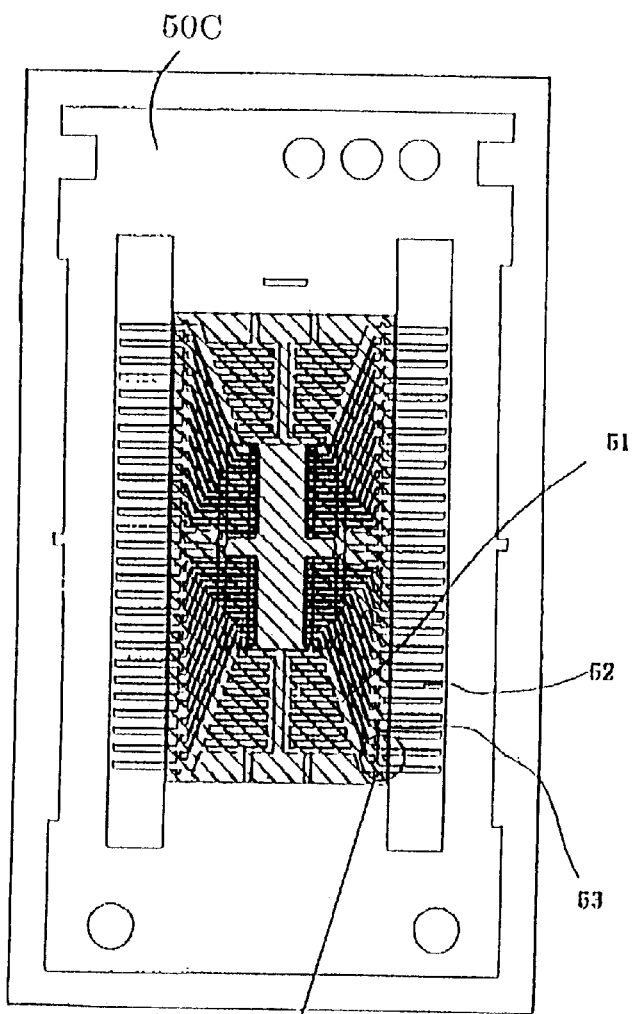
FIGS. 14(A) and (B) are plan views of the lead frame illustrated in FIG. 10, from which tie bars are cut out.
Figure 14:
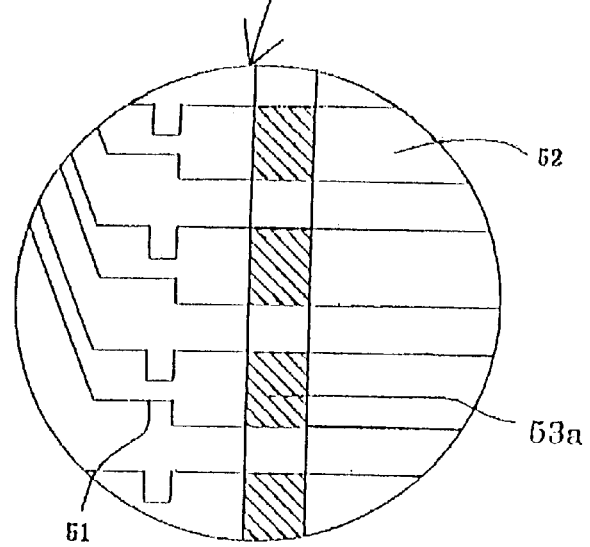

FIG. 14(A) illustrates the lead frame 50C where the tie bars 53 have been cut out. FIG. 14(B) is an enlarged view of an encircled portion in FIG. 14(A).

The tie bar 53 is cut out at hatched regions 53a illustrated in FIG. 14(B) to thereby allow the inner leads 51A and 51B and the outer leads 52A and 52B to be electrically independent from one another, as illustrated in FIG. 14(A).

Figure 3:
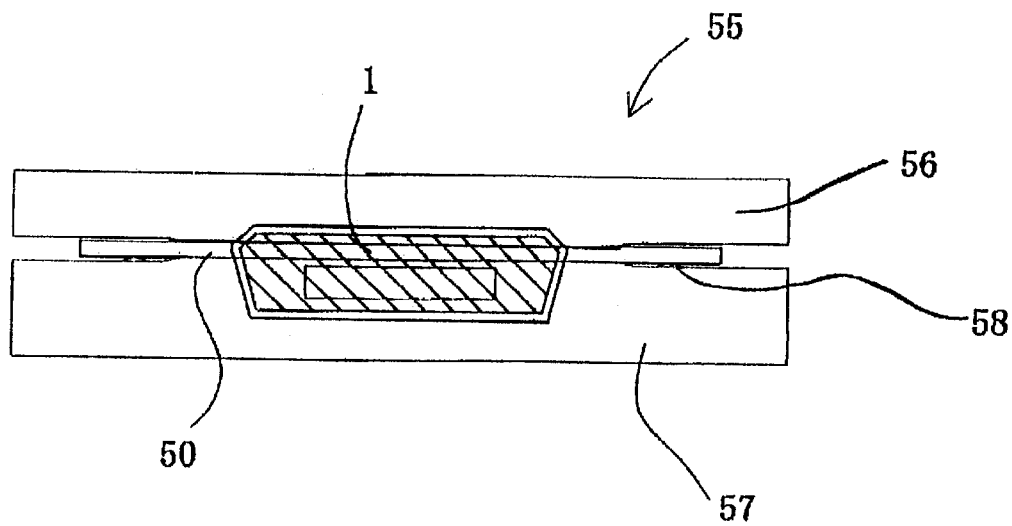
FIG. 3 is a cross-sectional view of a tester for testing electrical communication of a resin-packaged semiconductor device.
Figure 4A:
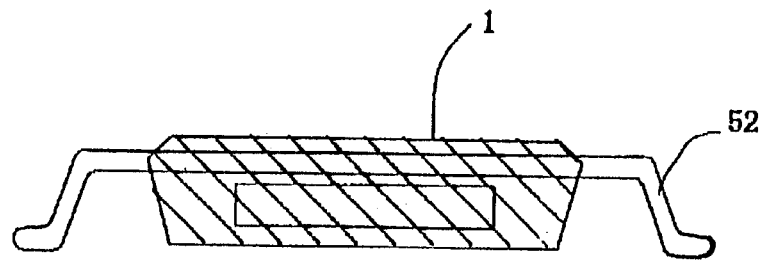
FIG. 4A is a cross-sectional view of a resin-packaged semiconductor device.
Figure 4B:
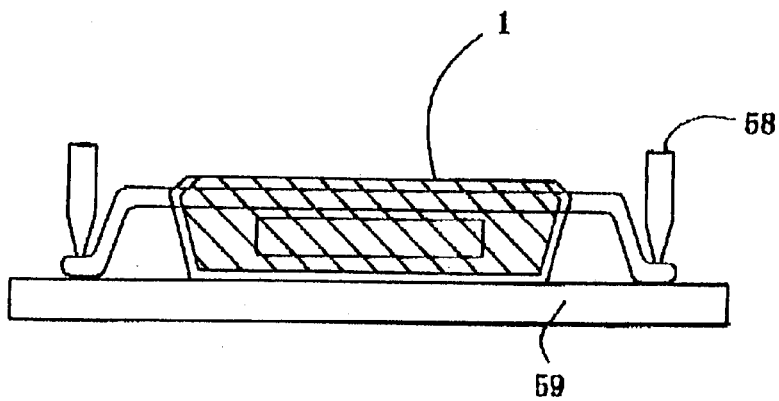
FIG. 4B is a cross-sectional view of a resin-packaged semiconductor device for which screening inspection is conducted.
Figure 5:
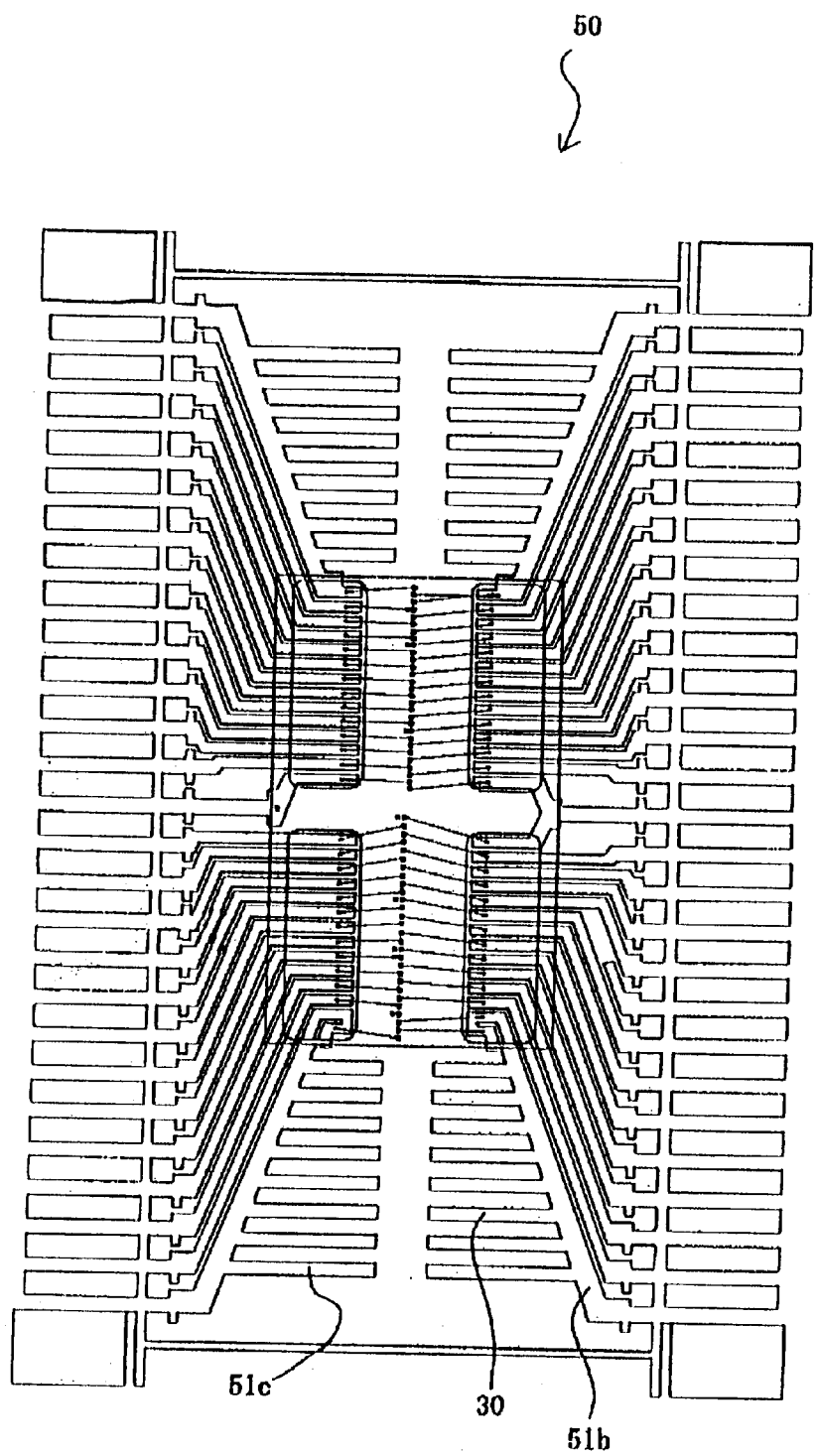
FIG. 5 is a plan view of a conventional lead frame.
Figure 6:
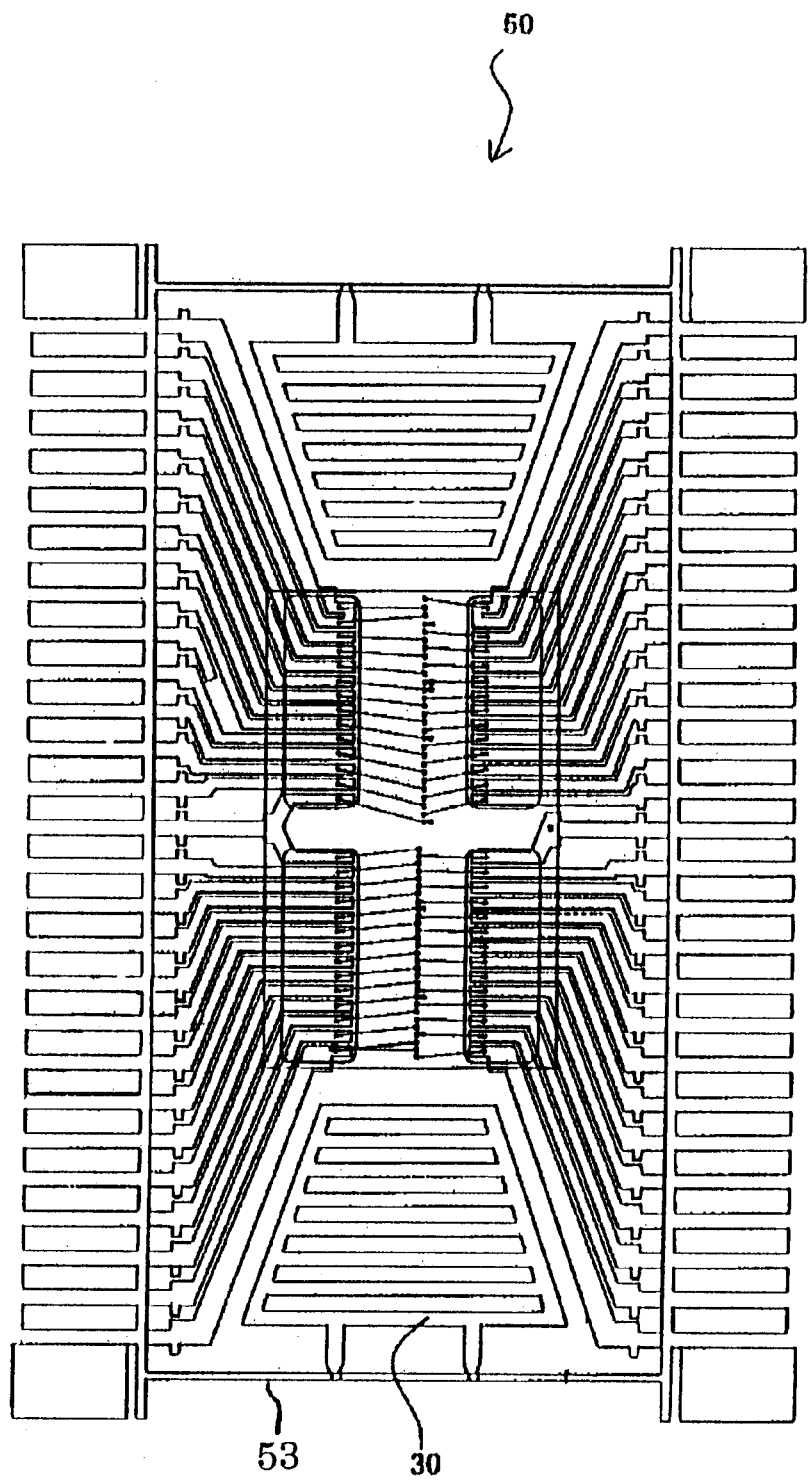
FIG. 6 is a plan view of another conventional lead frame.

Then, a semiconductor device having been sealed with resin is tested with respect to electrical communication. Test for electrical communication is conducted through the use of a tester illustrated in FIG. 3.

The illustrated tester is comprised of a socket 55 including an upper mold 56 and a lower mold 57. The lower mold 57 is formed at a surface thereof at opposite ends with recesses for exposing the outer leads 52 outside. Test pins 58 upwardly project from the lower mold 57 towards the upper mold 56 in the recesses so that the test pins 58 make contact with the outer leads 52 by virtue of resiliency of the outer leads 52.

The lead frame 50 already having experienced the step of cutting out the tie bars 53 is interposed between the upper mold 56 and the lower mold 57. When the upper and lower molds 56 and 57 are engaged to each other, the recesses formed with the lower mold 57 define a space between the upper and lower molds 56 and 57. The outer leads 52 are exposed to the space, and are electrically tested by means of the test pin 58 to which a testing device (not illustrated) is electrically connected.

In the above-mentioned method, after the inner leads 51A and 51B have been adhered to the electrically insulating adhesive tape 5, the control plate 101 may be positioned almost at a center in a width-wise direction of a semiconductor package. This positioning of the control plate 101 would make it possible to equally distribute resin to spaces above and below the inner leads 51A and 51B.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 10-359663 filed on Dec. 17, 1998 including specification, claims, drawings and summary is incorporated herein by reference in its entirety.

What is claimed is:

1. A lead frame comprising:
    (a) a first row of inner leads each of which is electrically connected to an associated electrode of a semiconductor chip;
    (b) a second row of inner leads each of which is electrically connected to an associated electrode of a semiconductor chip, said first and second rows of inner leads being situated at opposite sides about said semiconductor chip;
    (c) a first row of outer leads each of which is electrically connected to an associated inner lead in said first row of inner leads;
    (d) a second row of outer leads each of which is electrically connected to an associated inner lead in said second row of inner leads;
    (e) a tie bar connecting a first outermost inner lead in said first row of inner leads to a second outermost inner lead in said second row of inner leads; and
    (f) a control plate comprised of first branches extending from said first outermost inner lead towards said second outermost inner lead and second branches extending from said second outermost inner lead towards said first outermost inner lead, said control plate being connected to said tie bar.

2. The lead frame as set forth in claim 1, further comprising an electrically insulating adhesive tape which fixates said control plate relative to said first and second rows of inner leads.

3. The lead frame as set forth in claim 2, wherein said electrically insulating adhesive tape has a size extending to said tie bar.

4. The lead frame as set forth in claim 1, further comprising an electrically insulating film to which said first and second rows of inner leads are fixed.

5. The lead frame as set forth in claim 4, wherein said electrically insulating film is sandwiched between said first and second rows of inner leads and a semiconductor chip.

6. The lead frame as set forth in claim 4, wherein said electrically insulating film has at least one opening through which distal ends of said first or second row of inner leads and associated electrodes of said semiconductor chip are exposed.

7. The lead frame as set forth in claim 6, wherein said electrically insulating film has a first opening through which distal ends of said first row of inner leads are exposed, a second opening through which distal ends of said second row of inner leads are exposed, and a third opening through which electrodes of a semiconductor chip to which said first and second rows inner leads are connected are exposed.

8. A lead frame comprising:
    (a) a first row of inner leads each of which is electrically connected to an associated electrode of a semiconductor chip;
    (b) a second row of inner leads each of which is electrically connected to an associated electrode of a semiconductor chip, said first and second rows of inner leads being situated at opposite sides about said semiconductor chip;
    (c) a first row of outer leads each of which is electrically connected to an associated inner lead in said first row of inner leads;
    (d) a second row of outer leads each of which is electrically connected to an associated inner lead in said second row of inner leads;
    (e) a tie bar connecting a first outermost inner lead in said first row of inner leads to a second outermost inner lead in said second row of inner leads; and
    (f) a control plate comprised of (f1) first branches extending from said first outermost inner lead towards said second outermost inner lead, (f2) second branches extending from said second outermost inner lead towards said first outermost inner lead, (f3) a first bar which connects distal ends of said first branches to one another, and (f4) a second bar which connects distal ends of said second branches to one another, said control plate being connected to said tie bar.

9. The lead frame as set forth in claim 8, wherein said first and second bar extend to said tie bar.

10. The lead frame as set forth in claim 8, further comprising an electrically insulating adhesive tape which fixates said control plate relative to said first and second rows of inner leads.

11. The lead frame as set forth in claim 10, wherein said electrically insulating adhesive tape has a size extending to said tie bar.

12. The lead frame as set forth in claim 8, further comprising an electrically insulating film to which said first and second rows of inner leads are fixed.

13. The lead frame as set forth in claim 12, wherein said electrically insulating film is sandwiched between said first and second rows of inner leads and a semiconductor chip.

14. The lead frame as set forth in claim 12, wherein said electrically insulating film has at least one opening through which distal ends of said first or second row of inner leads and associated electrodes of said semiconductor chip are exposed.

15. The lead frame as set forth in claim 14, wherein said electrically insulating film has a first opening through which distal ends of said first row of inner leads are exposed, a second opening through which distal ends of said second row of inner leads are exposed, and a third opening through which electrodes of a semiconductor chip to which said first and second rows inner leads are connected are exposed.

16. A lead frame comprising:

(a) a first row of inner leads each of which is electrically connected to an associated electrode of a semiconductor chip;

(b) a second row of inner leads each of which is electrically connected to an associated electrode of a semiconductor chip, said first and second rows of inner leads being situated at opposite sides about said semiconductor chip;

(c) a first row of outer leads each of which is electrically connected to an associated inner lead in said first row of inner leads;

(d) a second row of outer leads each of which is electrically connected to an associated inner lead in said second row of inner leads;

(e) a tie bar connecting a first outermost inner lead in said first row of inner leads to a second outermost inner lead in said second row of inner leads; and (f) a control plate comprised of (f1) first branches extending from said first outermost inner lead towards said second outermost inner lead, (f2) second branches extending from said second outermost inner lead towards said first outermost inner lead, (f3) a first connecting bar which connects an outermost one in said first branches to said tie bar, and (f4) a second connecting bar which connects an outermost one in said second branches to said tie bar.

17. The lead frame as set forth in claim 16, wherein said first and second connecting bars are located symmetrically with each other about a center of said tie bar.

18. The lead frame as set forth in claim 16, wherein said control plate is comprised further of (f5) a first bar which connects distal ends of said first branches to one another, and (f6) a second bar which connects distal ends of said second branches to one another.

19. The lead frame as set forth in claim 18, wherein said first and second bar extend to said tie bar.

20. The lead frame as set forth in claim 16, further comprising an electrically insulating adhesive tape which fixates said control plate relative to said first and second rows of inner leads.

21. The lead frame as set forth in claim 20, wherein said electrically insulating adhesive tape has a size extending to said tie bar.

22. The lead frame as set forth in claim 16, further comprising an electrically insulating film to which said first and second rows of inner leads are fixed.

23. The lead frame as set forth in claim 22, wherein said electrically insulating film is sandwiched between said first and second rows of inner leads and a semiconductor chip.

24. The lead frame as set forth in claim 22, wherein said electrically insulating film has at least one opening through which distal ends of said first or second row of inner leads and associated electrodes of said semiconductor chip are exposed.

25. The lead frame as set forth in claim 24, wherein said electrically insulating film has a first opening through which distal ends of said first row of inner leads are exposed, a second opening through which distal ends of said second row of inner leads are exposed, and a third opening through which electrodes of a semiconductor chip to which said first and second rows inner leads are connected are exposed.

* * * * *